United States Patent
Li et al.

(10) Patent No.: US 10,613,171 B2
(45) Date of Patent: Apr. 7, 2020

(54) MULTI-BANDED RF-PULSE ENHANCED MAGNETIZATION IMAGING

(71) Applicants: Siemens Healthcare GmbH, Erlangen (DE); Regents of the University of Minnesota, Minneapolis, MN (US)

(72) Inventors: Xiufeng Li, Shoreview, MN (US); Gregory J. Metzger, Lake Elmo, MN (US); Kamil Ugurbil, Minneapolis, MN (US); Dingxin Wang, Apple Valley, MN (US)

(73) Assignees: Siemens Healthcare GmbH, Erlangen (DE); Regents of the University of Minnesota, Minneapolis, MN (US)

( * ) Notice: Subject to any disclaimer, the term of this patent is extended or adjusted under 35 U.S.C. 154(b) by 398 days.

(21) Appl. No.: 15/623,496

(22) Filed: Jun. 15, 2017

(65) Prior Publication Data
US 2018/0267120 A1    Sep. 20, 2018

Related U.S. Application Data

(60) Provisional application No. 62/471,129, filed on Mar. 14, 2017.

(51) Int. Cl.
*G01R 33/46* (2006.01)
*G01R 33/56* (2006.01)
*G01R 33/483* (2006.01)

(52) U.S. Cl.
CPC ......... *G01R 33/4616* (2013.01); *G01R 33/56* (2013.01); *G01R 33/5605* (2013.01); *G01R 33/4835* (2013.01)

(58) Field of Classification Search
CPC ........... G01R 33/4616; G01R 33/5605; G01R 33/56; G01R 33/4835
See application file for complete search history.

(56) References Cited

U.S. PATENT DOCUMENTS

| 7,308,298 B2 * | 12/2007 | Miyazaki | G01R 33/563 324/306 |
| 2011/0103670 A1 * | 5/2011 | Koch | G01R 33/243 382/131 |
| 2014/0149055 A1 * | 5/2014 | Falahatpisheh | G01P 5/001 702/45 |

(Continued)

OTHER PUBLICATIONS

Wolff, S.D. and R.S. Balaban, Magnetization transfer contrast (MTC) and tissue water proton relaxation in vivo. Magn Reson Med, 1989. 10(1): p. 135-144.

(Continued)

*Primary Examiner* — Dominic E Hawkins (57) ABSTRACT

Embodiments can provide a method for multi-banded RF-pulse enhanced magnetization imaging, the method comprising determining, by a processor, a frequency offset against a central frequency by specifying an offset frequency for one or more RF coils close to a frequency peak of mobile water; and simultaneously applying, by one or more RF coils, one or more bands of Gaussian RF pulses around the central frequency to a patient from a medical imaging device; wherein the one or more bands of Gaussian RF pulses are symmetrically applied having a distance from the central frequency equal to the frequency offset.

14 Claims, 8 Drawing Sheets

(56) References Cited

U.S. PATENT DOCUMENTS

| | | | | |
|---|---|---|---|---|
| 2014/0253120 A1* | 9/2014 | Ugurbil | ............... | A61B 5/055 324/309 |
| 2015/0301133 A1* | 10/2015 | Priatna | ............... | G01R 33/4835 324/309 |
| 2016/0084928 A1* | 3/2016 | Ouyang | ............. | G01R 33/5605 324/309 |
| 2016/0154080 A1* | 6/2016 | Wiens | ............... | G01R 33/56536 324/309 |
| 2017/0350951 A1* | 12/2017 | Samsonov | ........... | G01R 33/485 |

OTHER PUBLICATIONS

Rovaris, M., et al., Brain MRI correlates of magnetization transfer imaging metrics in patients with multiple sclerosis. J Neurol Sci, 1999. 166(1): p. 58-63.

Kabani, N.J., J.G. Sled, and H. Chertkow, Magnetization transfer ratio in mild cognitive impairment and dementia of Alzheimer's type. Neuroimage, 2002. 15(3): p. 604-610.

McGowan, J.C., et al., Magnetization transfer imaging in the detection of injury associated with mild head trauma. AJNR Am J Neuroradiol, 2000. 21(5): p. 875-880.

Okumura, A., et al., The characterization of human brain tumor using magnetization transfer technique in magnetic resonance imaging. Neurol Res, 1999. 21(3): p. 250-254.

Pike, G.B., et al., Magnetization transfer time-of-flight magnetic resonance angiography. Magn Reson Med, 1992. 25(2): p. 372-379.

Kenkel, D., et al., Magnetization transfer as a potential tool for the early detection of acute graft rejection after lung transplantation in mice. J Magn Reson Imaging, 2016.

Yarnykh, V.L., E.V. Tartaglione, and G.N. Ioannou, Fast macromolecular proton fraction mapping of the human liver in vivo for quantitative assessment of hepatic fibrosis. NMR Biomed, 2015. 28(12): p. 1716-1725.

Kim, J., et al., A review of optimization and quantification techniques for chemical exchange saturation transfer MRI toward sensitive in vivo imaging. Contrast Media Mol Imaging, 2015. 10(3): p. 163-178.

Vavasour, I.M., et al., Different magnetization transfer effects exhibited by the short and long T(2) components in human brain. Magn Reson Med, 2000. 44(6): p. 860-866.

Barker, G.J., P.S. Tofts, and A. Gass, An interleaved sequence for accurate and reproducible clinical measurement of magnetization transfer ratio. Magn Reson Imaging, 1996. 14(4): p. 403-411.

Sled, J.G. and G.B. Pike, Quantitative interpretation of magnetization transfer in spoiled gradient echo MRI sequences. J Magn Reson, 2000. 145(1): p. 24-36.

Lee, R.R. and A.P. Dagher, Low power method for estimating the magnetization transfer bound-pool macromolecular fraction. J Magn Reson Imaging, 1997. 7(5): p. 913-917.

\* cited by examiner

MULTI-BANDED RF-PULSE ENHANCED MAGNETIZATION IMAGING

CROSS-REFERENCE TO RELATED APPLICATIONS

This application claims the benefit of U.S. Provisional Application Ser. No. 62/471,129, filed Mar. 14, 2017, which is incorporated herein by reference in its entirety.

STATEMENT REGARDING FEDERALLY SPONSORED RESEARCH OR DEVELOPMENT

This invention was made with government support under P41 EB015894 and UL1TR000114 awarded by the National Institutes of Health. The government has certain rights in the invention.

TECHNOLOGY FIELD

The present invention relates generally to methods, systems, and apparatuses for improving magnetization transfer imaging (MTI) through enhanced contrast preparation.

BACKGROUND

Magnetization transfer (MT) imaging (MTI) provides a method to investigate the properties of protons that are bound to macromolecules in tissue. MTI has been used in clinical applications to investigate pathology-induced changes in tissue characteristics, such as multiple sclerosis (MS) white matter lesions, dementia, traumatic brain injury, and tumors, or to augment the contrast or visibility of low-MT tissue, such as blood in MR angiography. Recently, MTI has been shown as a promising technique to characterize tissue fibrosis.

In MTI, off-resonance RF pulses (e.g., a widely applied Gaussian RF pulse) are dominantly used with a bandwidth of several hundred hertz (Hz) and typically applied at a frequency offset at least 1 kHz from the mobile water peak to minimize direct saturation. To achieve off-resonance saturations of bound water spins within a large frequency range, the bandwidth of the MT RF pulses has to be increased. A consequence of the increased bandwidth is an undesired augmentation of direct saturation, unless the MT pulses are shifted further away from the mobile water. However, shifting the MT pulses further off-resonance has several disadvantages, including a decreased ability to saturate bound spins close to water and reduced MT contrast.

Furthermore, in a traditional MTI, the MT pulses are typically only applied with an offset frequency on one side of the mobile water peak (i.e., asymmetrical). It is well known that MT contrast in tissue can be asymmetric. To achieve a complete assessment of the pathology-induced MT effects from bound water spins with off-resonance frequencies both lower and higher than the mobile water peak, two MTI scans have to be performed, each applying an MT pulse with an offset on either side of the mobile water frequency, or the MT preparation has to be performed two times with two opposite frequency offsets before the imaging readout. Although the latter approach is more efficient than the first one, it prolongs time response and increases preparation waiting time and imaging readout time, with its MT contrast less optimal than that using the multi-banded RF pulses.

SUMMARY

Embodiments can provide a method for multi-banded RF-pulse enhanced magnetization imaging, the method comprising determining, by a processor, a frequency offset against a central frequency by specifying an offset frequency for one or more RF coils close to a frequency peak of mobile water; and simultaneously applying, by one or more RF coils, one or more bands of Gaussian RF pulses around the central frequency to a patient from a medical imaging device; wherein the one or more bands of Gaussian RF pulses are symmetrically applied having a distance from the central frequency equal to the frequency offset.

Embodiments can further provide a method further comprising applying, by the one or more RF coils, one or more additional Gaussian RF pulses on a side of the central frequency to the patient.

Embodiments can further provide a method wherein the one or more additional Gaussian RF pulses have a multi-band factor greater than or equal to two.

Embodiments can further provide a method wherein each of the one or more additional Gaussian RF pulses are designed with uneven spacing of frequency selection.

Embodiments can further provide a method further comprising modulating, by a radio-frequency system, the amplitude of each of the one or additional Gaussian RF pulses prior to application to the patient.

Embodiments can further provide a method further comprising combining the application of the one or more bands of Gaussian RF pulses with an image acquisition method.

Embodiments can further provide a method further comprising performing, by an image processor, a multi-banded and simultaneous multiple slice dual-echo GRE imaging readout.

In another illustrative embodiment, a computer program product comprising a computer usable or readable medium having a computer readable program is provided. The computer readable program, when executed on a processor, causes the processor to perform various ones of, and combinations of, the operations outlined above with regard to the method illustrative embodiment.

In yet another illustrative embodiment, a system is provided. The system may comprise a medical imaging device comprising a radio-frequency system configured to perform various ones of, and combinations of, the operations outlined above with regard to the method illustrative embodiment.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

To address the limitations of traditional MTI, embodiments disclosed herein describe the use of multi-banded RF pulses in MT preparation. Such a method can be referred to as Multi-Banded (MB) RF-pulse Enhanced Magnetization Imaging (MBE-MTI). These multi-banded RF pulses can provide not only the simultaneous off-resonance saturation of bound water spins on both sides of the central frequency of mobile water, but also can increase the coverage of off-resonance frequency range without increasing the potential of direct saturation, eliminating the need to increase the gap between the central frequency of mobile water and the MT pulses to maintain optimal MT contrast. Furthermore, MBE-MTI can allow multiple frequency selection and amplitude modulation for each band of the MT pulses. This unique feature can be used to target specific groups of macromolecules.

Figure 1:
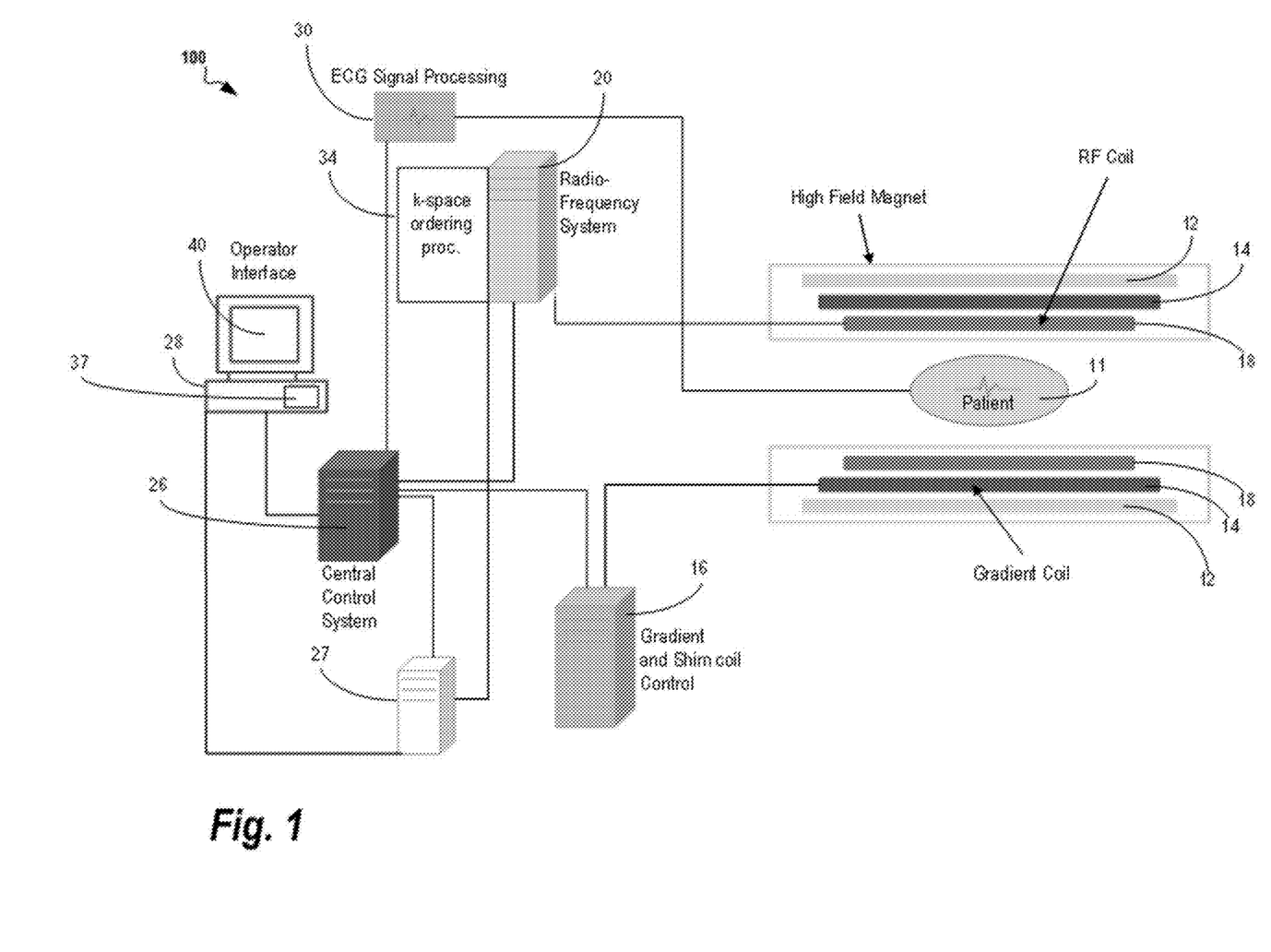
FIG. 1 shows a medical imaging device for acquiring multi-banded RF-pulse enhanced magnetization images, as used by some embodiments of the present invention.

FIG. 1 shows a medical imaging device 100 for acquiring multi-banded RF-pulse enhanced magnetization images, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. Electrocardiography (ECG) synchronization signal generator 30 provides ECG signals used for pulse sequence and imaging synchronization. A two or three dimensional k-space storage array of individual data elements in k-space component processor unit 34 stores corresponding individual frequency components comprising a magnetic resonance dataset. The k-space array of individual data elements has a designated center and each individual data element individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of a magnetic resonance dataset representing a magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components which are substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques generally known in the art may be used for reconstruction.

Figure 2:
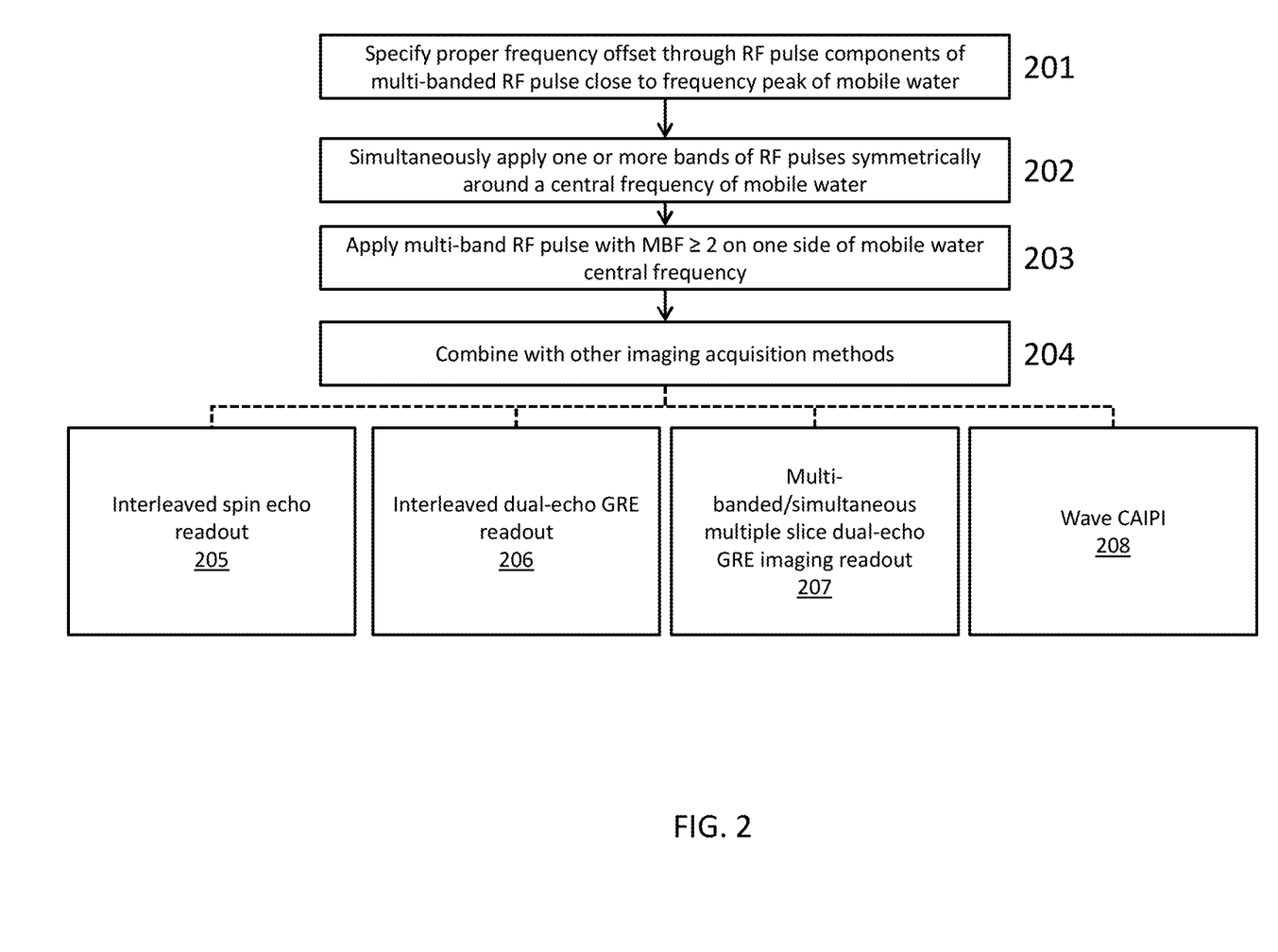
FIG. 2 illustrates a flowchart depicting Multi-Banded (MB) RF-pulse Enhanced Magnetization Imaging (MBE-MTI)
Figure 3:
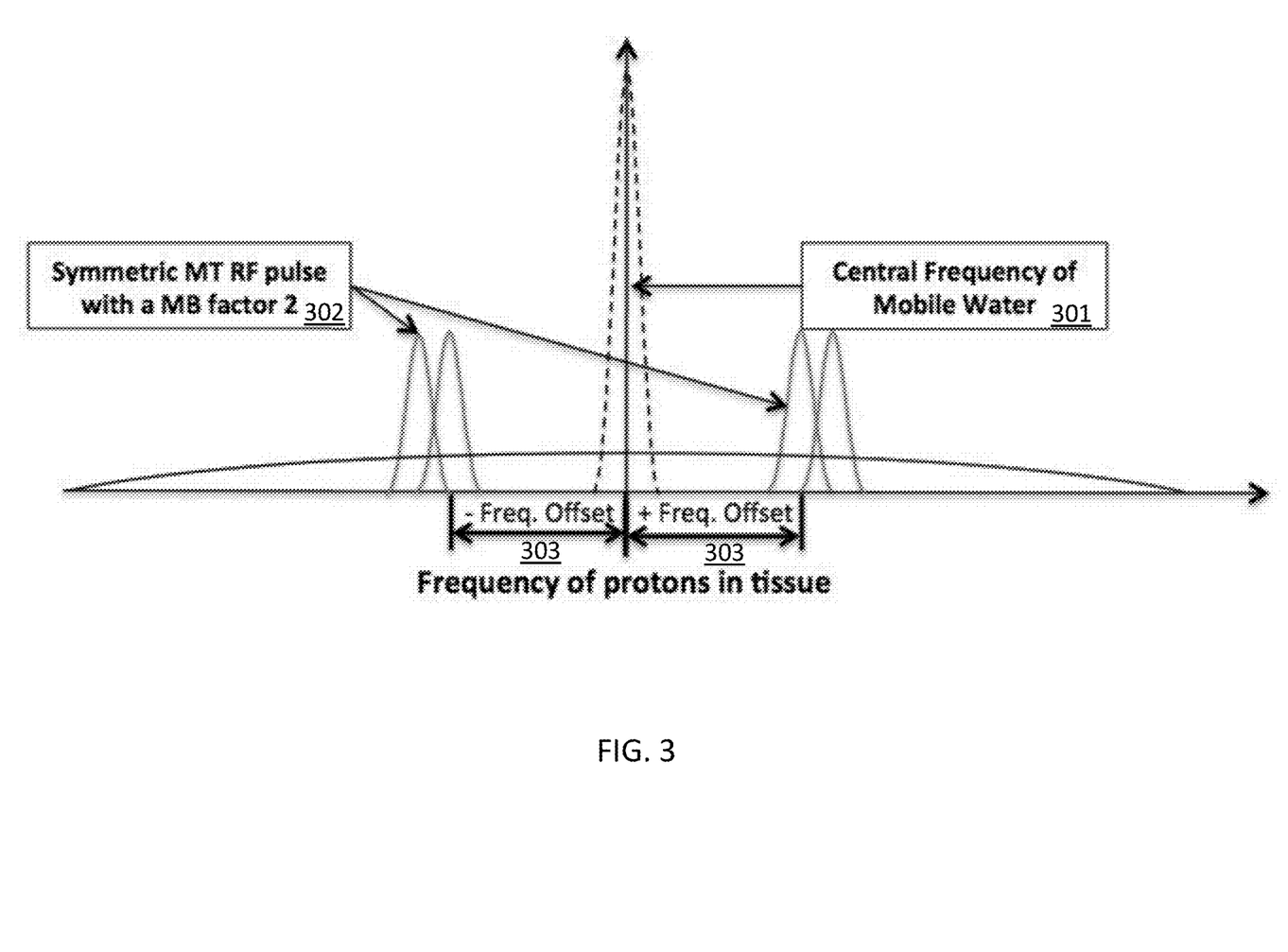
FIG. 3 depicts symmetric RF-pulses provided around a central frequency, in accordance with embodiments described herein.

FIG. 2 illustrates a flowchart depicting Multi-Banded (MB) RF-pulse Enhanced Magnetization Imaging (MBE-MTI). In MBE-MTI, the preparation of MT contrast can be achieved by applying multi-banded MT pulses, such as the Gaussian RF pulse. The designed multi-banded RF pulses for MTI can be flexible. First, a frequency offset (303 as shown in FIG. 3) can be achieved by specifying an offset frequency for the RF pulse components of the multi-banded RF pulse that are close to a frequency peak of mobile water 201. After determining the proper frequency offset (303 as shown in FIG. 3), one or more bands of Gaussian RF pulses (302 as shown in FIG. 3) can be applied simultaneously and symmetrically around the central frequency (301 as shown in FIG. 3) of mobile water 202. The one or more bands of Gaussian RF pulses each are applied around the central frequency at an offset equal to the frequency offset equally applied in a positive or negative manner.

Figure 4:
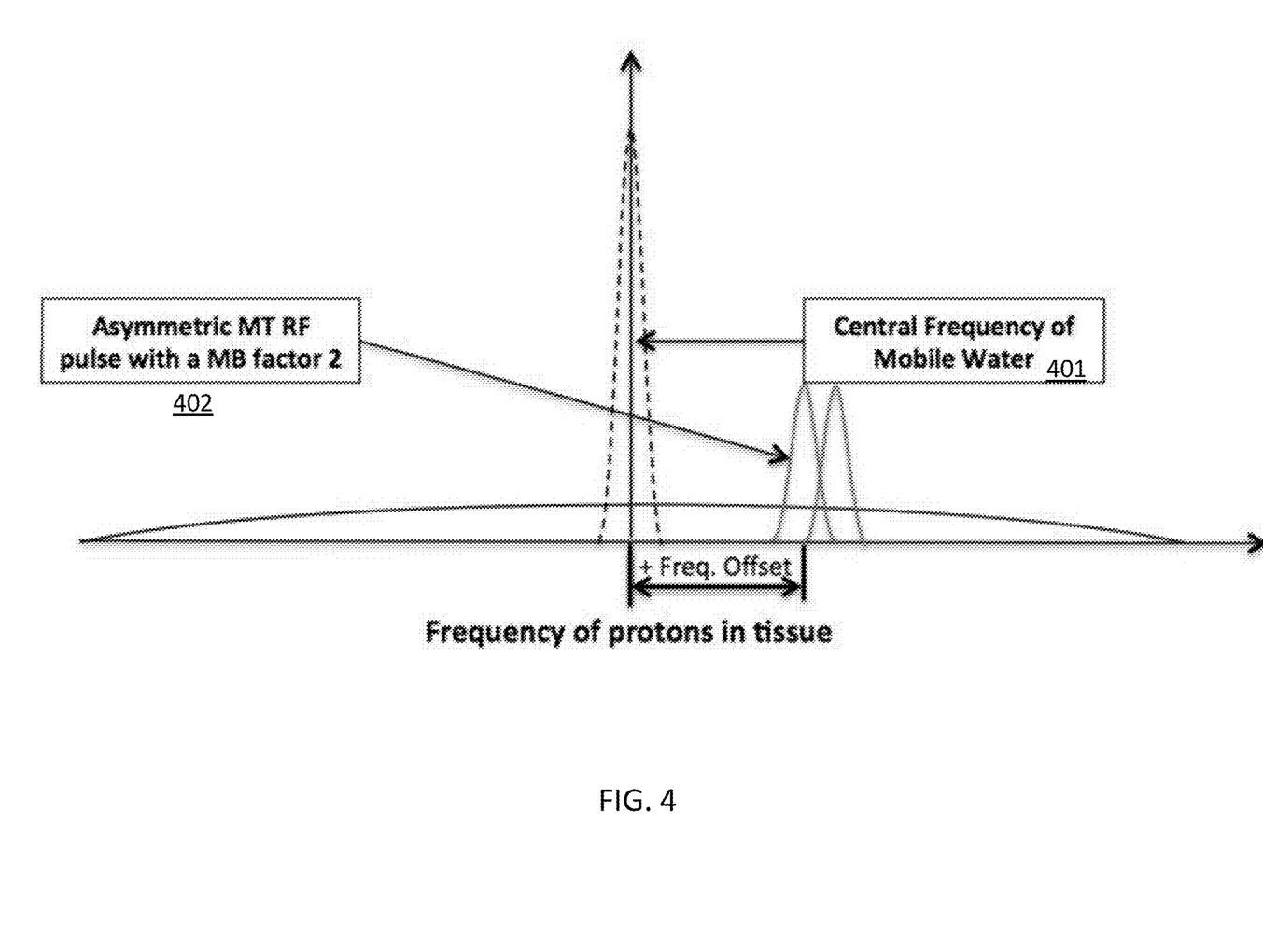
FIG. 4 asymmetric RF-pulses provided around a central frequency, in accordance with embodiments described herein.
Figure 5A:
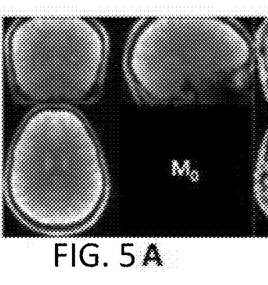
FIGS. 5A-5E depict brain MTI results from a representative subject having undergone MBE-MTI, in accordance with embodiments described herein.
Figure 5B:
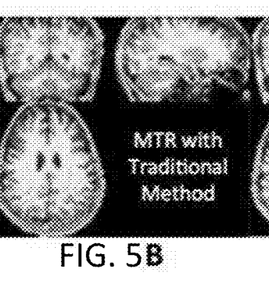
Figure 5C:
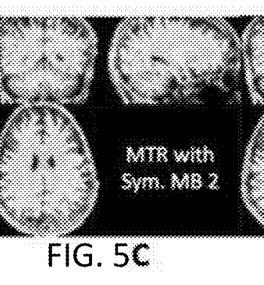
Figure 5D:
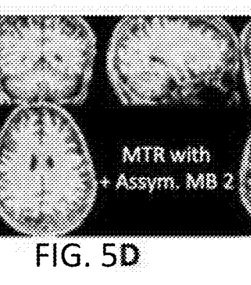
Figure 5E:
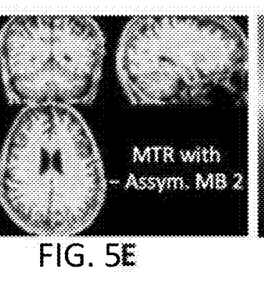

In an embodiment, one or more additional asymmetric multi-band or Gaussian RF pulses with a multi-band factor greater than or equal to two (402 as shown in FIG. 4) can also be applied on one side of the mobile water's central frequency (402 as shown in FIG. 4) to perform MT preparation in the traditional manner 203. This can be used to meet the requirement of larger off-resonance frequency coverage, but can eliminate the need to shift the MT preparation RF pulses further away from the mobile water frequency peak to avoid the increased direct saturation as in traditional MT preparation using a single RF pulse. Such an approach can maintain an optimal MT contrast because the increase of frequency offset for MT RF pulse will reduce the MT contrast level. In an embodiment, the multi-band RF pulses with a multi-band factor greater than or equal to two can be designed with uneven spacing of frequency selection.

In an embodiment, multi-band RF pulses can have different amplitude modulations for each RF band. For example, utilizing higher amplitude for the frequency bands that are closer to the central water frequency and utilizing lower amplitude for the frequency bands that are further away from the central water frequency, which can reduce SAR.

The proposed MBE-MTI method provides a novel and alternative way to perform MT contrast preparation. Such a method can be combined with an application of any appropriate imaging acquisition methods 204, including, but not limited to interleaved spin echo readout 205 to examine bound water with both short and long T2 values and interleaved dual-echo GRE readout 206 to have automatically co-registered $M_0$ and MT images. Particularly, to increase the efficiency of imaging acquisitions with the less motion-sensitivity methods, such as a 2D GRE readout, the proposed method can be combined with a multi-banded/simultaneous multiple slice dual-echo GRE imaging readout 207, or the wave CAIPI method 208. Any suitable image acquisition method can be combined 204.

The multi-banded MT contrast preparation approach combined with selected imaging readouts can be readily applied for quantitative MT imaging (qMTI) using the magnetization transfer model, e.g., two-pool exchange model with five parameters, or for bound fraction estimation using a first-order solution to the two-pool exchange model. The MBE-MTI method can also be useful for chemical exchange saturation transfer (CEST) imaging applications.

To evaluate MBE-MTI, studies have been performed in both the brain and kidneys with healthy volunteers. For brain MTI, both 2D and 3D gradient recalled echo (GRE) imaging readouts were applied, while for kidney MTI, 2D GRE imaging readout was used for a single slice acquisition within one breath. Although 3D GRE imaging readouts can provide high raw imaging signal-to-noise ratio, especially for high-resolution MTI, compared to 2D GRE imaging readout, 3D GRE imaging readout can be more sensitive to subject motion.

The major parameters for brain MTI were as follows: TR/TE=1500/3.38 ms; flip angle=25 degree; resolution=2× 2×3 mm$^3$; the number of slices=36; phase encoding direction=anterior to posterior; and parallel imaging acceleration factor (iPAT GRAPPA)=2 with integrated 24 reference lines; partial Fourier=6/8; the number of measurements=2 with the first image as MT free image (M0) and the second image MT contrast prepared image. The major parameters for renal MTI were: TR/TE=100/1.67 ms; flip angle=25 degree; resolution=2×2×5 mm$^3$; the number of slices=1; phase encoding direction=right to left; and parallel imaging acceleration factor (iPAT GRAPPA)=2 with integrated 24 reference lines; partial Fourier=6/8; the number of measurements=2 with the first image as M0 and the second image MT contrast prepared image.

In the presented studies, the MT contrast preparation utilized Gaussian RF pulse. Imaging scans were performed to compare a single Gaussian RF pulse with its multi-band versions. The MT contrast preparation using a single Gaussian RF pulse is referred to as the traditional method. The MT contrast preparation using a multi-band Gaussian RF pulse can have two major variations: 1) symmetric MT contrast preparation using one or more bands of Gaussian RF pulses symmetrically positioned on both sides of the central frequency of mobile water; 2) asymmetric MT contrast preparation using multi-band Gaussian RF pulses on one side of the central frequency of mobile water with either positive or negative frequency offsets.

In these studies, a fixed frequency offset equal to 1.2 kHz was applied. When a multi-band Gaussian RF pulse was applied, this frequency offset is used to shift the first RF band of the multiband RF pulse that is close to the mobile water peak to be 1.2 kHz away, and the other bands of the multi-band RF pulse are shifted according to the Gaussian RF bandwidth. For example, when a multiband Gaussian RF pulse with a multi-band factor of 2 (MB 2) is applied with a positive 1.2 kHz frequency offset, the first RF pulse band will have the 1.2 kHz frequency offset, and the second band will have a frequency offset equal to 1.2 kHz plus the bandwidth of the Gaussian RF pulse.

In the evaluation of the enhancement of the MT contrast by multi-band RF pulses, different maximum flip angles constrained by the specific absorption rate (SAR) limit were applied separately for the traditional and the new methods along with the same imaging readout parameters: a 700 degree flip angle for the traditional MT preparation and a 500 degree flip angle for the multi-band RF preparation with an MB factor of 2.

FIGS. 5A-5E depict brain MTI results from a representative subject: $M_0$ image (FIG. 5A), MTR maps using the traditional MT contrast preparation method with a single Gaussian RF pulse (FIG. 5B), a symmetric MB Gaussian RF pulse with a MB factor 2 (FIG. 5C), a MB Gaussian RF pulse with a MB factor 2 applied using a positive (+) (FIG. 5D) and a negative (−) (FIG. 5E) frequency offsets. All the images were acquired with the same parameters for the GRE readout, but different flip angles for MT preparation RF pulses: an allowed maximal flip angle of 700 degrees for traditional MT contrast preparation, and a flip angle of 500 degrees for MB RF pulses.

Figure 6A:
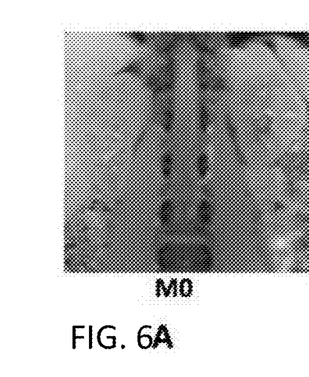
FIGS. 6A-6E depict kidney MTI results from a representative subject having undergone MBE-MTI, in accordance with embodiments described herein.
Figure 6B:
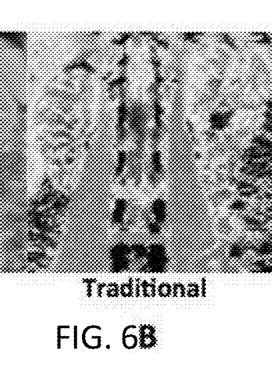
Figure 6C:
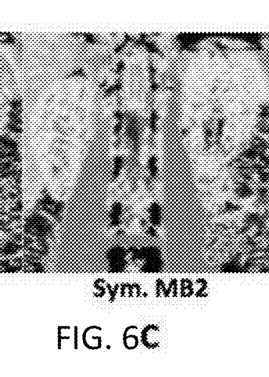
Figure 6D:
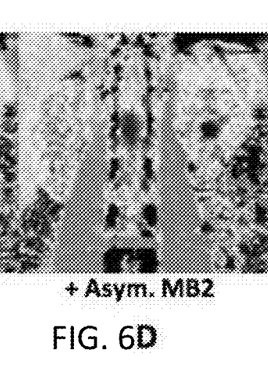
Figure 6E:
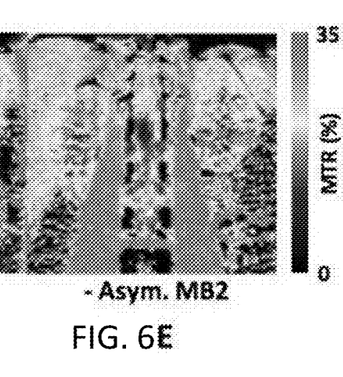

FIGS. 6A-6E depict kidney MTI results from one representative subject: $M_0$ image (FIG. 6A), MTR maps using the traditional MT contrast preparation with a single Gaussian RF pulse (FIG. 6B), a symmetric MB Gaussian RF pulse with a MB factor 2 (FIG. 6C), a MB Gaussian RF pulse with a MB factor 2 applied using a positive (+) (FIG. 6D) and negative (−) frequency offsets (FIG. 6E). All the images were acquired with the same parameters for the GRE readout, but different flip angles for MT preparation RF pulses: an allowed maximal flip angle of 700 degrees for traditional MT contrast preparation, and a flip angle of 500 degrees for MB RF pulses.

Figure 7A:
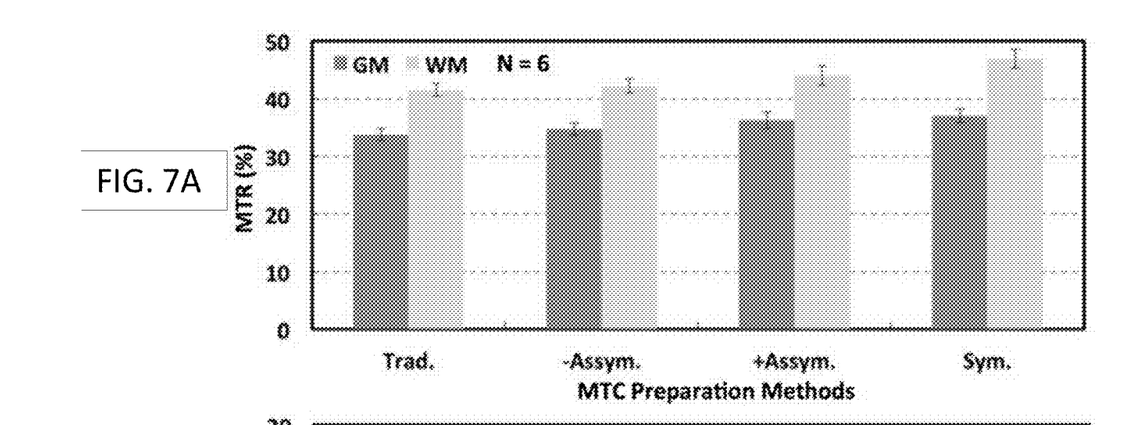
FIGS. 7A-7B depict magnetization transfer rate (MTR) and MTR percent differences between two different MT contrast preparation methods during a 3D brain MTI.
Figure 7B:
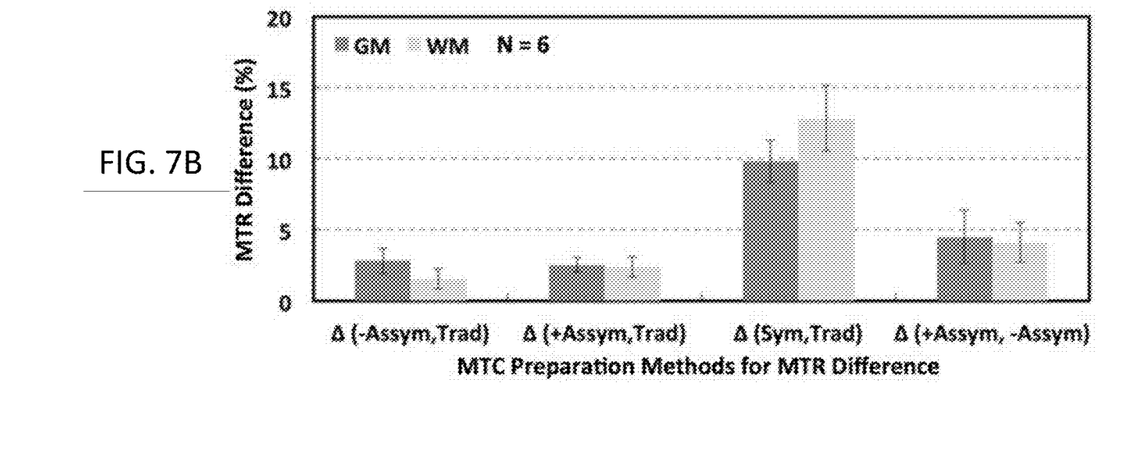

FIGS. 7A-7B depict magnetization transfer rate (MTR) (FIG. 7A) and MTR percent differences between two different MTC preparation methods (FIG. 7B) from 3D brain MTI: Trad. denotes traditional method, −Assym/+Assym denotes MBE-MTC preparations with an MB factor 2 applied at a negative/positive frequency offset, Sym. denotes a symmetric MBE-MTC preparation with a MB factor of 1, and Δ denotes difference. The error bars represent the standard deviations of the measurements.

Figure 8:
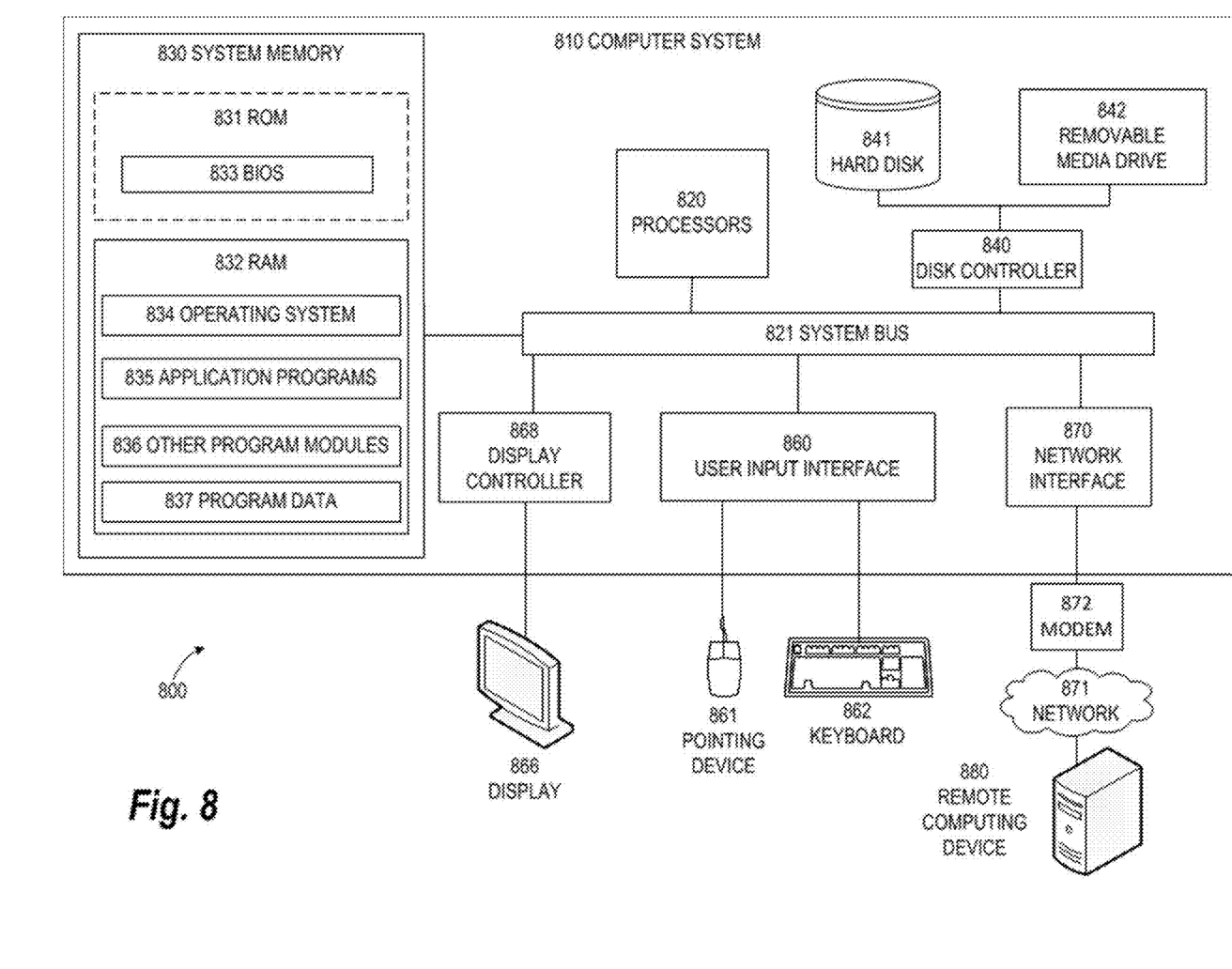
FIG. 8 illustrates an exemplary computing environment within which embodiments of the invention may be implemented.

FIG. 8 illustrates an exemplary computing environment 800 within which embodiments of the invention may be implemented. For example, the computing environment 800 may be used to implement one or more of the components illustrated in the system 100 of FIG. 1. The computing environment 800 may include computer system 810, which is one example of a computing system upon which embodiments of the invention may be implemented. Computers and computing environments, such as computer system 810 and computing environment 800, are known to those of skill in the art and thus are described briefly here.

As shown in FIG. 8, the computer system 810 may include a communication mechanism such as a bus 821 or other communication mechanism for communicating information within the computer system 810. The computer system 810 further includes one or more processors 820 coupled with the bus 821 for processing the information. The processors 820 may include one or more central processing units (CPUs), graphical processing units (GPUs), or any other processor known in the art.

The computer system 810 also includes a system memory 830 coupled to the bus 821 for storing information and instructions to be executed by processors 820. The system memory 830 may include computer readable storage media in the form of volatile and/or nonvolatile memory, such as read only memory (ROM) 831 and/or random access memory (RAM) 832. The system memory RAM 832 may include other dynamic storage device(s) (e.g., dynamic RAM, static RAM, and synchronous DRAM). The system memory ROM 831 may include other static storage device(s) (e.g., programmable ROM, erasable PROM, and electrically erasable PROM). In addition, the system memory 830 may be used for storing temporary variables or other intermediate information during the execution of instructions by the processors 820. A basic input/output system (BIOS) 833 containing the basic routines that help to transfer information between elements within computer system 810, such as during start-up, may be stored in ROM 831. RAM 832 may contain data and/or program modules that are immediately accessible to and/or presently being operated on by the processors 820. System memory 830 may additionally include, for example, operating system 834, application programs 835, other program modules 836 and program data 837.

The computer system 810 also includes a disk controller 840 coupled to the bus 821 to control one or more storage devices for storing information and instructions, such as a hard disk 841 and a removable media drive 842 (e.g., floppy disk drive, compact disc drive, tape drive, and/or solid state drive). The storage devices may be added to the computer system 810 using an appropriate device interface (e.g., a small computer system interface (SCSI), integrated device electronics (IDE), Universal Serial Bus (USB), or FireWire).

The computer system 810 may also include a display controller 868 coupled to the bus 821 to control a display 866, such as a cathode ray tube (CRT) or liquid crystal display (LCD), for displaying information to a computer user. The computer system includes an input interface 860 and one or more input devices, such as a keyboard 862 and a pointing device 861, for interacting with a computer user and providing information to the processor 820. The pointing device 861, for example, may be a mouse, a trackball, or a pointing stick for communicating direction information and command selections to the processor 820 and for controlling cursor movement on the display 866. The display 866 may provide a touch screen interface which allows input to supplement or replace the communication of direction information and command selections by the pointing device 861.

The computer system 810 may perform a portion or all of the processing steps of embodiments of the invention in response to the processors 820 executing one or more sequences of one or more instructions contained in a memory, such as the system memory 830. Such instructions may be read into the system memory 830 from another computer readable medium, such as a hard disk 841 or a removable media drive 842. The hard disk 841 may contain one or more datastores and data files used by embodiments of the present invention. Datastore contents and data files may be encrypted to improve security. The processors 820 may also be employed in a multi-processing arrangement to execute the one or more sequences of instructions contained in system memory 830. In alternative embodiments, hard-wired circuitry may be used in place of or in combination with software instructions. Thus, embodiments are not limited to any specific combination of hardware circuitry and software.

As stated above, the computer system 810 may include at least one computer readable medium or memory for holding instructions programmed according to embodiments of the invention and for containing data structures, tables, records, or other data described herein. The term "computer readable medium" as used herein refers to any medium that participates in providing instructions to the processor 820 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 841 or removable media drive 842. Non-limiting examples of volatile media include dynamic memory, such as system memory 830. Non-limiting examples of transmission media include coaxial cables, copper wire, and fiber optics, including the wires that make up the bus 821. Transmission media may also take the form of acoustic or light waves, such as those generated during radio wave and infrared data communications.

The computing environment 800 may further include the computer system 810 operating in a networked environment using logical connections to one or more remote computers, such as remote computer 880. Remote computer 880 may be a personal computer (laptop or desktop), a mobile device, a server, a router, a network PC, a peer device or other common network node, and typically includes many or all of the elements described above relative to computer system 810. When used in a networking environment, computer system 810 may include modem 872 for establishing communications over a network 871, such as the Internet. Modem 872 may be connected to bus 821 via user network interface 870, or via another appropriate mechanism.

Network 871 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 810 and other computers (e.g., remote computer 880). The network 871 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 871.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A method for performing magnetization transfer preparation in a magnetization transfer imaging, the method comprising:
   determining, by a processor, a first frequency offset against a central frequency of mobile water, wherein the central frequency is a frequency peak of the mobile water; and
   simultaneously applying, by one or more RF coils, a plurality of multi-banded Gaussian RF pulses around the central frequency to a patient from a medical imaging device, wherein each multi-banded Gaussian RF pulse includes at least two RF pulse components, and each RF pulse component has a different frequency offset;
   wherein the plurality of multi-banded Gaussian RF pulses are symmetrically applied, wherein a distance between a first RF pulse component of each multi-banded Gaussian RF pulse and the central frequency is equal to the first frequency offset, wherein the first RF pulse component is closest to the central frequency.

2. The method as recited in claim 1, wherein each RF pulse component is designed with a different frequency selection.

3. The method as recited in claim 1, further comprising:
   modulating, by a radio-frequency system, a different amplitude of each RF pulse component prior to application to the patient.

4. The method as recited in claim 1, further comprising:
   combining the application of the plurality of multi-banded Gaussian RF pulses with an image acquisition method.

5. The method as recited in claim 1, further comprising:
   performing, by an image processor, a multi-banded and simultaneous multiple slice dual-echo GRE imaging readout.

6. A computer program product for performing magnetization transfer preparation in a magnetization transfer imaging, the non-transitory computer program product comprising a non-transitory computer readable storage medium having program instructions embodied therewith, the program instructions executable by a processor to cause the processor to:
   determine a first frequency offset against a central frequency of mobile water, wherein the central frequency is a frequency peak of the mobile water; and
   simultaneously apply a plurality of multi-banded Gaussian RF pulses around the central frequency to a patient from a medical imaging device, wherein each multi-banded Gaussian RF pulse includes at least two RF pulse components, and each RF pulse component has a different frequency offset;

wherein the plurality of multi-banded Gaussian RF pulses are symmetrically applied, wherein a distance between a first RF pulse component of each multi-banded Gaussian RF pulse and the central frequency is equal to the first frequency offset, wherein the first RF pulse component is closest to the central frequency.

7. The computer program product as recited in claim 6, wherein each RF pulse component is designed with a different frequency selection.

8. The computer program product as recited in claim 6, wherein the processor is further caused to:
modulate a different amplitude of each RF pulse component prior to application to the patient.

9. The computer program product as recited in claim 6, wherein the processor is further caused to:
combine the application of the plurality of multi-banded Gaussian RF pulses with an image acquisition method.

10. The computer program product as recited in claim 6, wherein the processor is further caused to:
perform a multi-banded and simultaneous multiple slice dual-echo GRE imaging readout.

11. A system for simultaneous multi-slice pulse wave velocity measurement, the system comprising:
a medical imaging device comprising:
a magnetic field generator;
a gradient and shim coil control module; and
a radio-frequency system configured to:
determine a first frequency offset against a central frequency of mobile water, wherein the central frequency is a frequency peak of the mobile water;
simultaneously apply a plurality of multi-banded Gaussian RF pulses around the central frequency to a patient from a medical imaging device, wherein each multi-banded Gaussian RF pulse includes at least two RF pulse components, and each RF pulse component has a different frequency offset;
wherein the plurality of multi-banded Gaussian RF pulses are symmetrically applied, wherein a distance between a first RF pulse component of each multi-banded Gaussian RF pulse and the central frequency is equal to the first frequency offset, wherein the first RF pulse component is closest to the central frequency.

12. The system as recited in claim 11, wherein each RF pulse component is designed with a different frequency selection.

13. The system as recited in claim 11, wherein the radio-frequency system is further configured to:
modulate a different amplitude of each RF pulse component prior to application to the patient.

14. The system as recited in claim 11, wherein the radio-frequency system is further configured to:
combine the application of the plurality of multi-banded Gaussian RF pulses with an image acquisition method.

* * * * *